United States Patent [19]

Thomas et al.

[11] Patent Number: 4,808,548

[45] Date of Patent: Feb. 28, 1989

[54] METHOD OF MAKING BIPOLAR AND MOS DEVICES ON SAME INTEGRATED CIRCUIT SUBSTRATE

[75] Inventors: Mammen Thomas, San Jose; Matthew Weinberg, Mountain View, both of Calif.

[73] Assignee: Advanced Micro Devices, Inc., Sunnyvale, Calif.

[21] Appl. No.: 123,823

[22] Filed: Nov. 23, 1987

Related U.S. Application Data

[62] Division of Ser. No. 777,149, Sep. 18, 1985.

[51] Int. Cl.⁴ ............ H01L 21/70; H01L 27/00; H01L 21/265
[52] U.S. Cl. ............ 437/57; 148/DIG. 9; 148/DIG. 124; 148/DIG. 10; 148/DIG. 11; 437/31; 437/32; 437/33; 437/44; 437/56; 437/67; 437/200; 437/201; 437/202; 357/43; 357/59
[58] Field of Search ............ 437/67, 31, 33, 34, 437/40, 41, 44, 56, 57, 200, 189, 201, 202; 148/DIG. 9, DIG. 124, DIG. 147, DIG. 10, DIG. 11; 357/23.3, 23.11, 34, 35, 41, 42, 43, 49, 59 G, 59 H, 59 I

[56] References Cited

U.S. PATENT DOCUMENTS

| | | | |
|---|---|---|---|
| 4,475,279 | 10/1984 | Gahle | 437/59 |
| 4,727,046 | 2/1988 | Tuntasood et al. | 437/41 |
| 4,734,382 | 3/1988 | Krishna | 437/26 |
| 4,735,911 | 4/1988 | Schaber | 437/41 |
| 4,746,963 | 5/1988 | Uchida et al. | 437/67 |

FOREIGN PATENT DOCUMENTS 0139266 5/1985 European Pat. Off.

*Primary Examiner*—Brian E. Hearn
*Assistant Examiner*—Mary Wilczewski
*Attorney, Agent, or Firm*—John P. Taylor

[57] ABSTRACT

An improved integrated circuit structure is disclosed comprising bipolar and MOS devices formed on the same substrate. The bipolar devices have at least the emitter and the collector contact portions formed from a polysilicon layer which results in raised contacts. The MOS devices are similarly formed with raised gate contact portions formed from the same polysilicon layer. Metal silicide is formed over at least a portion of the base, source, and drain regions to provide conductive paths to the base, source, and drain contacts. In one embodiment, the base, source, and drain contacts are also formed from the same polysilicon layer to permit formation of a highly planarized structure with self-aligned contacts formed by planarizing an insulating layer formed over the structure sifficiently to expose the upper surface of the contacts.

19 Claims, 16 Drawing Sheets

METHOD OF MAKING BIPOLAR AND MOS DEVICES ON SAME INTEGRATED CIRCUIT SUBSTRATE

CROSS-REFERENCE TO RELATED APPLICATIONS

This application is a division of Thomas et al U.S. patent application Ser. No. 777,149 filed Sept. 18, 1985.

BACKGROUND OF THE INVENTION

1. Field of the Invention

This invention relates to the fabrication of bipolar and MOS devices on an integrated circuit substrate. More particularly, this invention relates to the production of a fast bipolar transistor and an at least one MOS transistor on the same substrate using raised polysilicon contacts for at least some of the electrodes.

2. Description of the Prior Art

In the construction of integrated circuits, the active devices usually comprises either bipolar or MOS type devices. Bipolar devices may be chosen instead of MOS due to their high current carrying characteristics and superior transconductance of the devices. On the other hand, the use of MOS devices, in preference to bipolar devices, usually occurs when either the low power consumption or high density characteristics of MOS devices are needed or desired.

In many instances, it would be most desirable to use both types of devices in an integrated circuit structure to achieve certain desired effects, e.g., fast logic and low power storage. However, this may be difficult due to the differences in the techniques which have evolved to construct bipolar and MOS devices; particularly when such techniques may be addressed toward remedying a problem which is peculiar to one particular device.

For example, in the construction of bipolar devices, the spacing between the emitter and the base contact in prior art bipolar transistors is defined by lithography and isolated by oxide. This makes it necessary to have a high dose implanted or diffused extrinsic base region under the oxide which acts as the interconnect between the intrinsic base and the base contact. This high doping of the extrinsic base region results in unacceptable increases in capacitance between the base and the buried collector. This problem becomes particularly acute when the thickness of the epitaxial layer between the base and the buried collector is reduced for improved performance which results in the base butting against the buried collector layer to thereby raise the capacitance and slow down the speed of the device.

Furthermore, since the resistance of the doped extrinsic base region still does not approach the conductivity of polysilicon or metal, the minmum base resistance of the extrinsic base region, i.e., the resistance of the extrinsic base between the intrinsic base and the base contact, is always a factor degrading performance of such a device.

Another problem in prior art bipolar devices which adversely impacted the speed of such devices was the side diffusion of the highly doped extrinsic base into the emitter which reduced the emitter area and thereby prevented shrinking of the emitter area which would otherwise be desirable to improve performance of the device by reducing the capacitance between the emitter and the intrinsic base beneath the emitter. Furthermore, in conventional emitter contruction, sidewall capacitance cannot be reduced to gain performance improvement.

Conventional construction of single crystal emitters further limits the gain of the device as well as reducing the ability to provide a shallow emitter without incurring problems of reverse injection of carriers from base to emitter.

In our prior U.S. patent application Ser. No. 747,517, filed June, 21, 1985, now U.S. Pat. No. 4,682,409, and entitled FAST BIPOLAR TRANSISTOR FOR INTEGRATED CIRCUIT STRUCTURE AND METHOD OF MAKING SAME, cross reference to which is hereby made, we described and claimed a structure having a raised polysilicon emitter contact with oxide spacers on the sidewalls and a metal silicide conductive path on the surface between the base contact and a point adjacent the oxide spacer to provide a faster device with higher gain and lower capacitance and resistance.

MOS devices are usually constructed in a non planarized fashion with steps created when making contact with the source and drain regions which are lower than the gate region. Also, despite the high density of the MOS devices, the gate contact usually occupies a large area due to the need to make the contact in a position offset to the gate region because of aligment problems.

Furthermore, in the construction of MOS devices, the source and drain junctions may be formed too deep causing the junctions to sometimes extend under the gate region causing overlap capacitance which degrades the performance of the device. The extension of the junction under the gate may be caused by forming the junction too deeply in the substrate. This can also cause the depletion region to extend sideways into the channel causing a short channel effect which further degrades the performance and functionality as well as long term reliability. If the source and drain regions can be formed as shallow junctions, which do not extend laterally, e.g., beneath the gate, the junction capacitance may also be lowered because of the reduction in the junction area.

It would, therefore, be very desirable to be able to fabricate both bipolar and MOS devices on the same substrate; preferably in a manner which would address the problems of each of the particular devices discussed above.

SUMMARY OF THE INVENTION

It is therefore an object of this invention to provide an improved integrated circuit structure containing both bipolar and MOS devices characterized by fast operation, low power consumption, and low capacitance and a method of making same.

It is another object of this invention to provide an improved integrated circuit structure containing both bipolar and MOS devices having at least some of the electrode contacts formed using polysilicon with self-aligned contacts.

It is yet another object of this invention to provide an improved integrated circuit structure containing both bipolar and MOS devices having a metal silicide layer over a portion of at least some of the electrode contacts to lower the base resistance of the bipolar device and raise the current carrying capability of the MOS device.

It is a further object of this invention to provide an improved integrated circuit structure containing both bipolar and MOS devices and having oxide spacers formed adjacent the sidewalls of the raised polysilicon emitter and gate electrodes.

It is yet a further object of this invention to provide an improved integrated circuit structure containing both bipolar and MOS devices using planarization techniques to provide separate contacts to the electrodes of the devices.

It is a still further object of this invention to provide an improved integrated circuit structure containing both bipolar and MOS devices having a raised polysilicon base, source, and drain contacts which may be opened simultaneously with the opening of the emitter, gate, and collector contacts to eliminate step to the base, source, and drain contacts.

These and other objects of the invention will become apparent from the following description and accompanying drawings.

In accordance with the invention, an improved integrated circuit structure is provided comprising a bipolar device having a polysilicon emitter formed over a base region of a silicon substrate with oxide spacer portions formed on the sides of the emitter and an MOS device having a polysilicon gate with oxide spacer portions formed on the sides of the gate.

DESCRIPTION OF THE INVENTION

Figure 1:
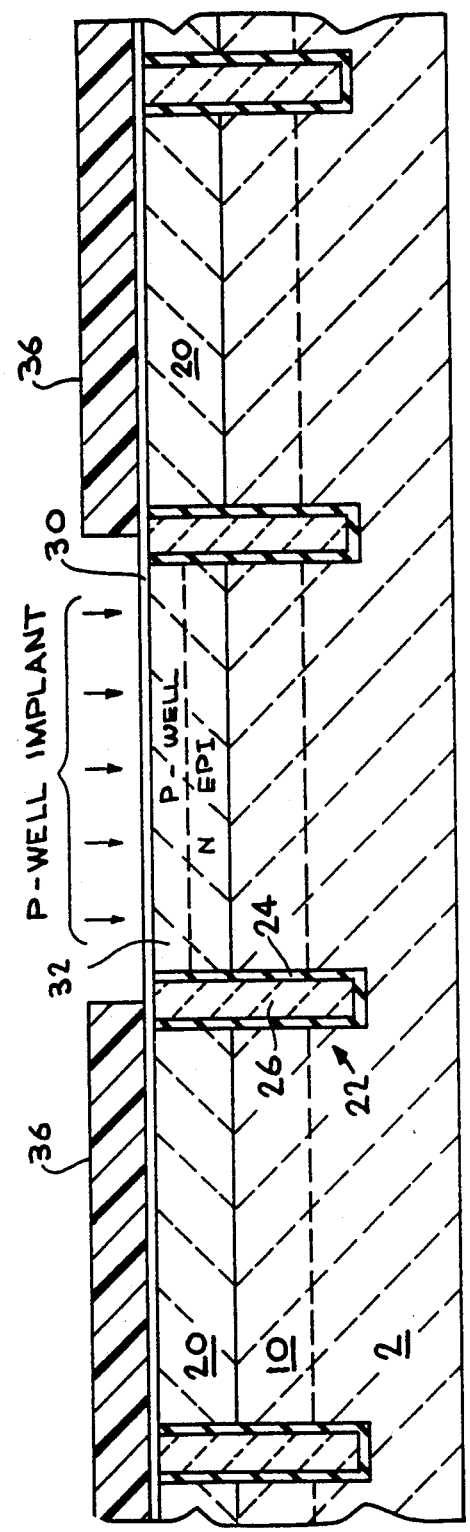
FIG. 1 is a fragmentary vertical cross-sectional view of an integrated circuit structure illustrating an early stage of the construction of the improved integrated circuit structure of the invention.

Referring now to FIG. 1, a buried N+ collector 10 is shown as already formed in P-type silicon substrate 2 with an N epitaxial silicon layer 20 grown over buried collector 10 and a thin buffer layer 30 of oxide, e.g., about 300 Angstroms, applied over epitaxial layer 20. Buried layer 10 may extend over the entire substrate as shown, or may be formed only in the bipolar region by appropriate masking. Isolation slots 22 may then be formed which extend down from the surface through epitaxial layer 20 and buried layer 10 into substrate 2. Slots 22 may be lined with an isolation oxide 24 and then filled at 26 with polysilicon. The areas in which will be formed the bipolar and PMOS devices are then masked at 36, e.g., with a photoresist mask, to permit P implantation into the N epitaxial layer 20 to form P well 32.

It should be noted here, that while a slot type of isolation is illustrated here, other forms of isolation such as isoplanar or junction isolation may also be used in connection with the practice of this invention.

Figure 2:
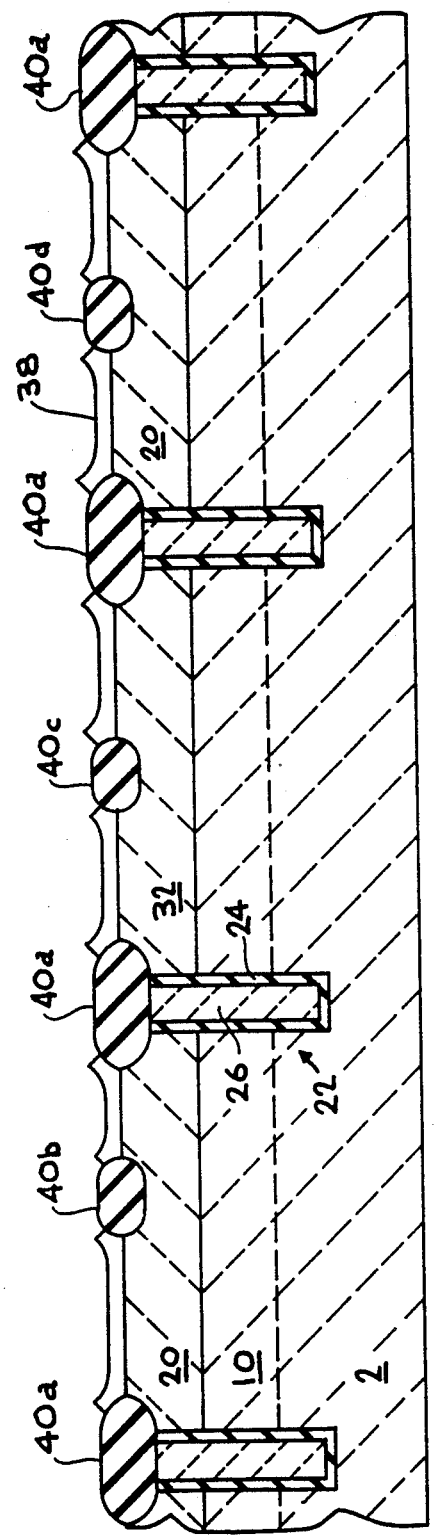
FIGS. 2–10 are fragmentary vertical cross-sectional views illustrating subsequent stages of the construction of one embodiment of the improved integrated circuit structure of the invention.

P well mask 36 is then removed and epitaxial layer 20 is covered with a nitride layer 38, as shown in FIG. 2, which is then appropriately masked to permit growth of field oxide isolation areas 40a, 40b, 40c, and 40d. Field oxide areas 40a are formed over slots 22 and cooperate with the slots to separate adjacent devices of different types, e.g., to separate bipolar from PMOS, and PMOS from NMOS. Field oxide 40b serves to separate the base contact of the bipolar device from the collector contact.

Field oxide 40c separates adjacent NMOS devices and field oxide 40d separates adjacent PMOS devices.

Figure 3:
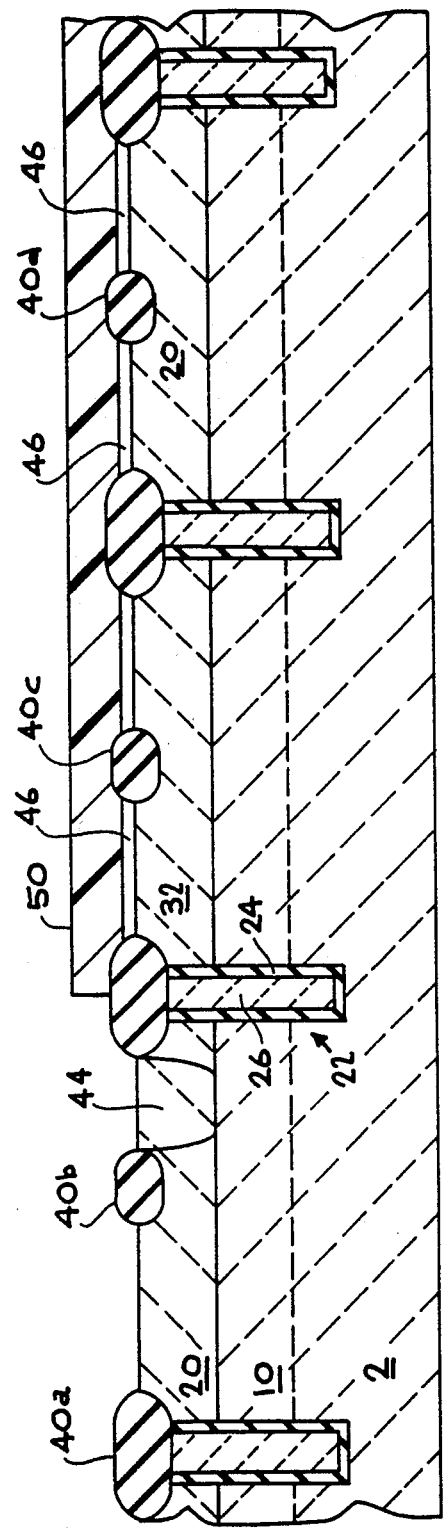

Nitride layer 38 is then masked to open up sinker 44 as shown in FIG. 3 which is then formed by an N+ implantation to form the N+ sinker which will provide the connection to buried collector layer 10.

After formation of sinker 44, nitride layer 38 is stripped off. A gate oxide layer 46 is then formed on the surface of epitaxial layer 20 which is partially removed by masking the MOS areas with photoresist mask 50 to permit removal of gate oxide layer 46 from the bipolar regions of the structure.

Figure 4:
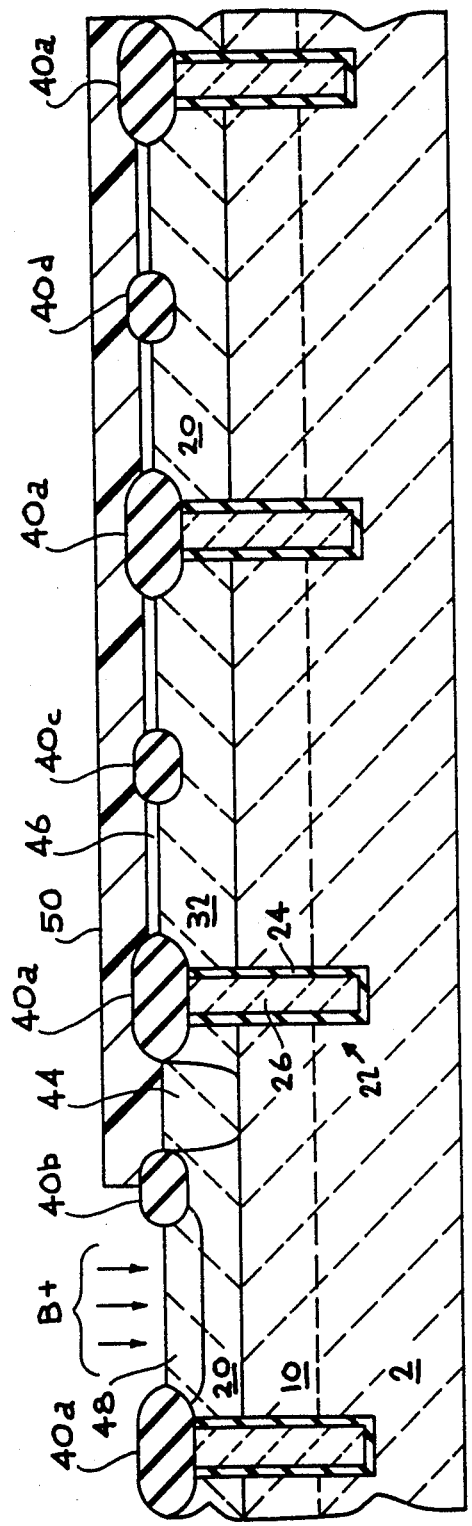

After removal of the gate oxide layer 46 in the bipolar region, the surface of sinker 44 is also masked and the remainder of the bipolar region is doped, e.g., by a P+ implantation, with boron, to form a P doped intrinsic base region 48 as shown in FIG. 4. Alternatively, the P+ implantation may be done before the gate oxide is stripped in the bipolar region.

Figure 5:
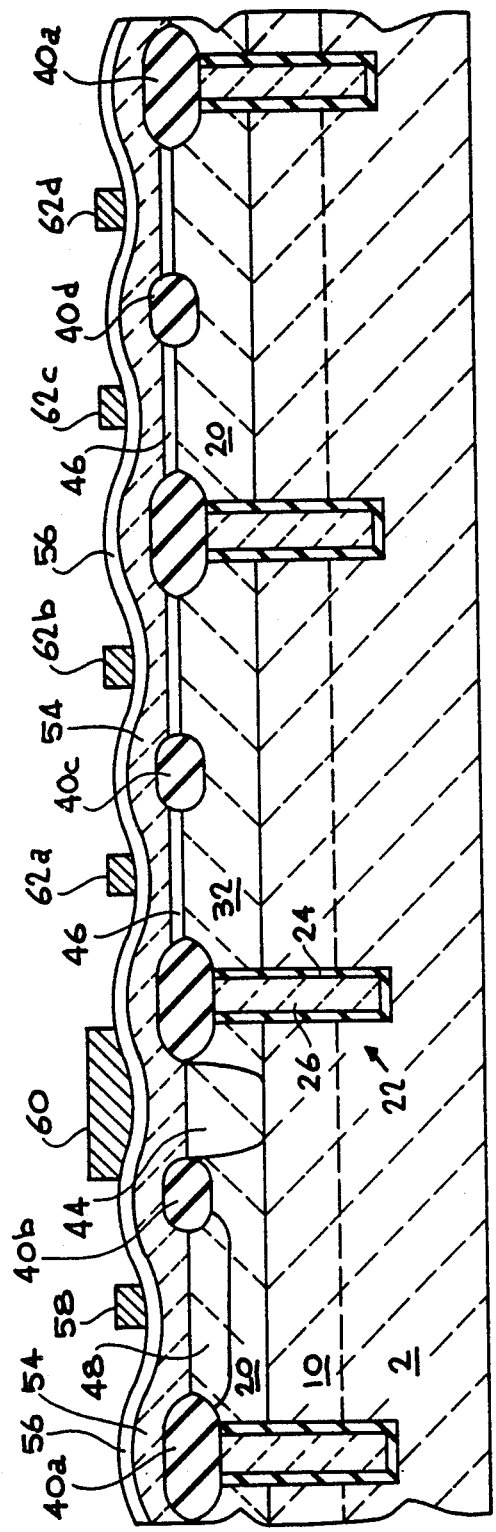

As shown in FIG. 5, mask 50 is then removed and a 3000–5000 angstrom polysilicon layer 54 is formed over the entire surface followed by application of a nitride layer 56 thereover. Polysilicon layer 54 is doped with an N dopant, such as, for example, a $POCl_3$ diffusion or an Arsenic+ implant, to form an N+ layer. In one embodiment of the invention, polysilicon layer 54, and nitride layer 56 thereon, are then masked to define the emitter at 58, the collector at 60 and the gates at 62a, 62b, 62c, and 62d. The remainder of polysilicon layer 54 is then plasma etched away leaving raised polysilicon emitter contact 70, raised polysilicon collector contact 74, and raised polysilicon gate contacts 80a, 80b, 80c, and 80d.

the now exposed gate oxide 46 over the source and drain regions may now be removed using an etchant such as, for eample, a $NH_3$-Acetic acid etch. A 300 Angstrom protective layer of oxide 66 is then grown on the now exposed sides of the polysilicon contacts 70, 74, 80a, 80b, 80c, and 80d with the remainder of nitride layer 56 providing a mask for the top surfaces of the raised contacts. The heat used for this growth, i.e., about 1000° C. for about 10–20 minutes, also serves to lightly diffuse doped emitter contact 70 into intrinsic base region 48 to form emitter region 72 in intrinsic base region 48.

Figure 6:
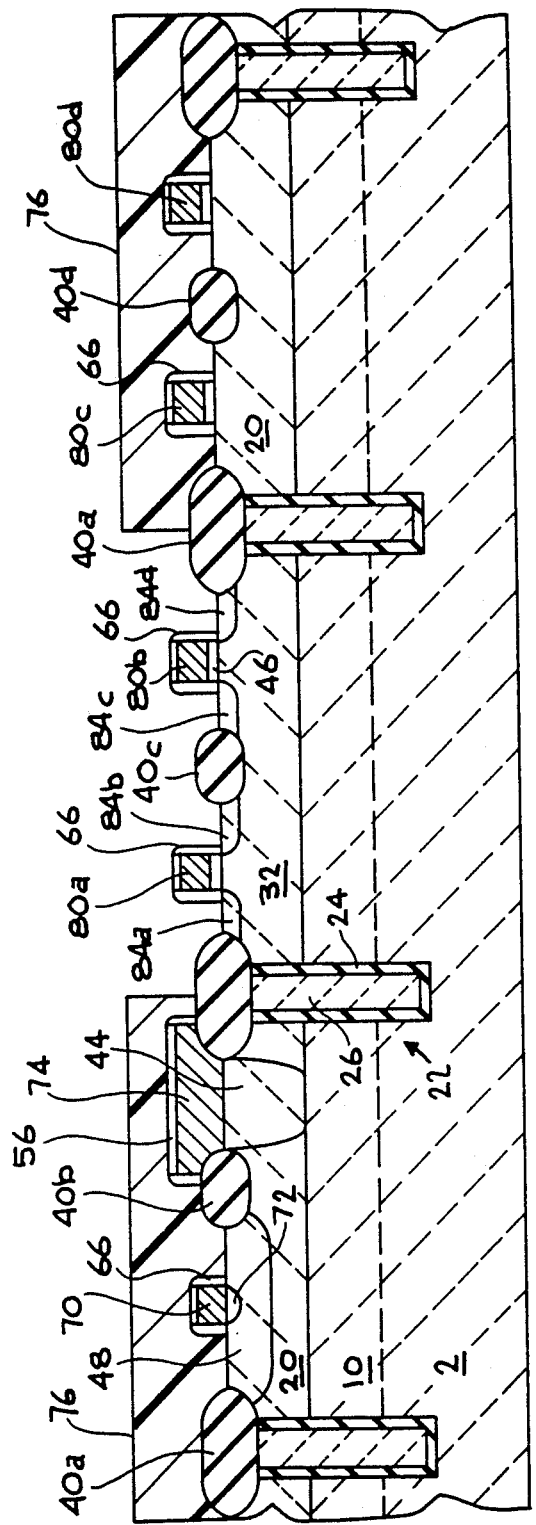

The bipolar and PMOS regions are then masked with a photoresist mask 76 and lightly doped (LDD) source and drains regions 84a, 84b, 84c, and 84 d are formed in P well 32 in the NMOS region by an N—implant as shown in FIG. 6.

Figure 7:
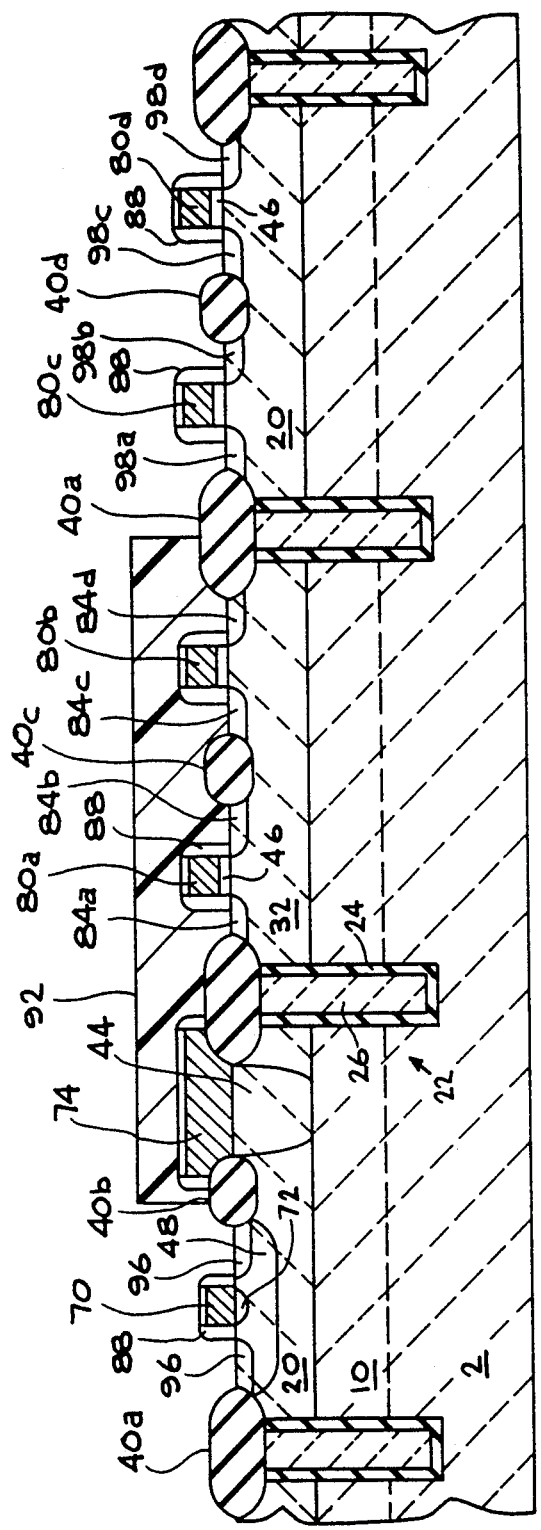

Turning now to FIG. 7, photoresist mask 76 is now removed and a layer of oxide, from which will be formed theoxide spacers, is then formed over the structure. This oxide is then subjected to a reactive ion etch (RIE) to remove ost of the oxide leaving only oxide spacer portions 88 on the sides of the raised polysilicon contacts 0, 74, 80a, 80b, 80c, and 80d. Alternatively, spacers 88 may be grown by differential oxidation wherein the oxide will grow faster on the doped polysiicon comprising raised contacts 70, 74, and 80a-80d than on epitaxial layer 20. Alternatively, spacer 88 may comprise other insulating materials such as nitride. the NMOS region and the collector contact of the bipolar device are then masked with photoresist 92. A P+ implant, using, for example, $BF_2$, is then made to provide a P+ extrinsic base region 96 in P base 48 on each side of emitter contact 70 in the bipolar region; and to provide source and drain regions 98a, 98b, 98c, and 98d in epitaxial layer 20 in the PMOS region as illustrated in FIG. 7.

Figure 8:
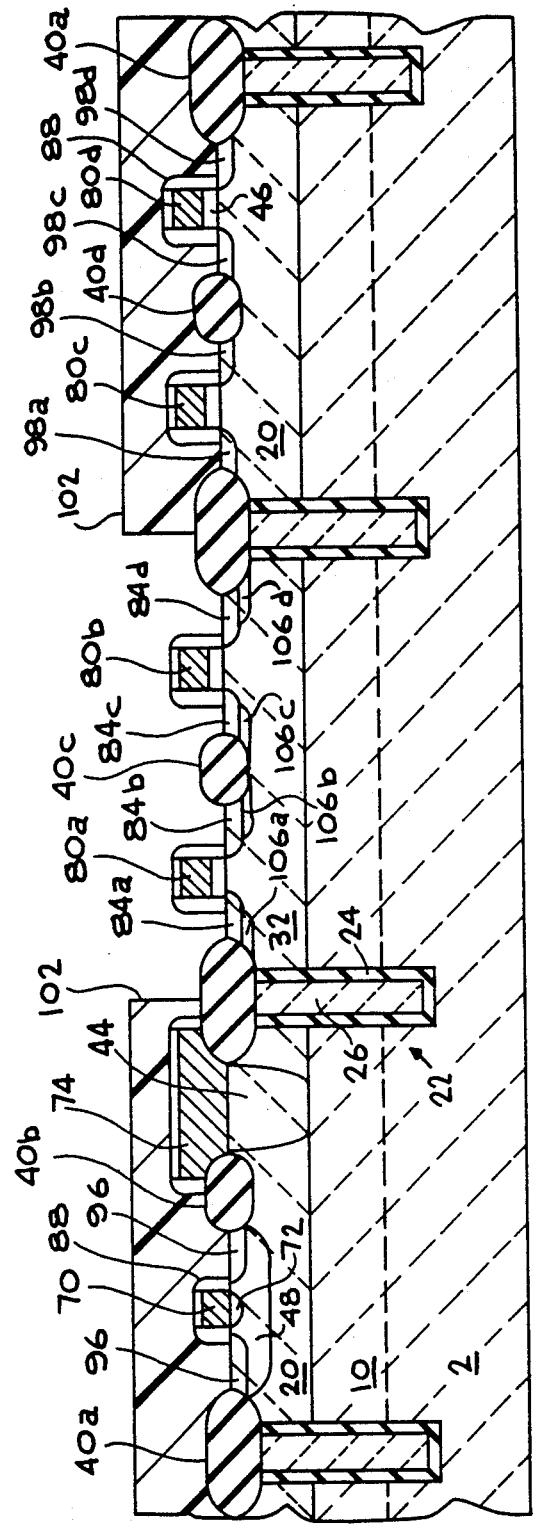

The bipolar and PMOS regions are then masked with photoresist mask 102, as shown in FIG. 8, and N+ source and drain regions 106a, 106b, 1006c, and 106d are then implanted with arsenic. Photoresist mask 102 is then stripped and an implant anneal is performed, e.g., at 1000° C. for 10 minutes, or by a "rapid thermal anneal".

Figure 9:
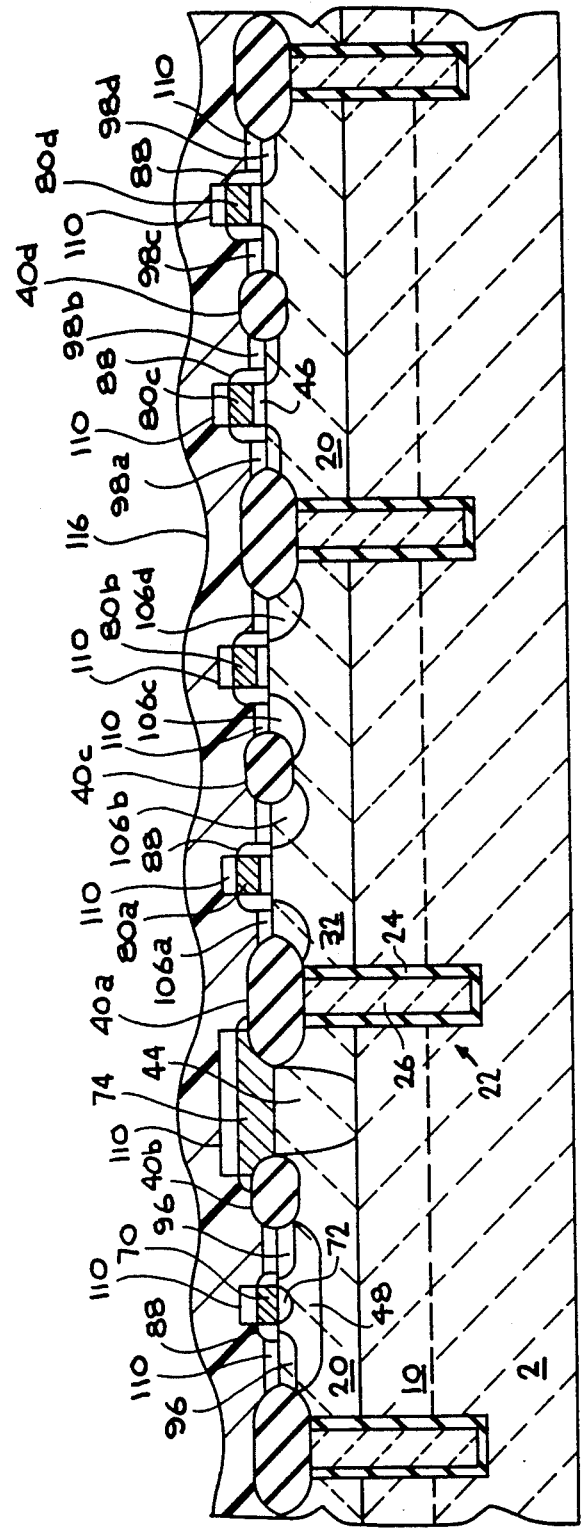

The remaining nitride on the raised emitter, collector, and gate contacts is then stripped and a metal, capable of forming a silicide, such as, for example, platinum, or titanium, is deposited to form metal silicide layer 110 over the respective emitter, collector, and gate contacts as shown in FIG. 9.

Planarization layer 116 is then applied over the structure and planarized to clear the respective emitter, collector and gate contacts, i.e., to expose the metal silicide coating 110 on the upper surface of the contacts as also shown in FIG. 9. Planarization layer 116 may comprise an oxide, a nitride, or a polyimide, or any combination thereof, or any other insulation material.

Figure 10:
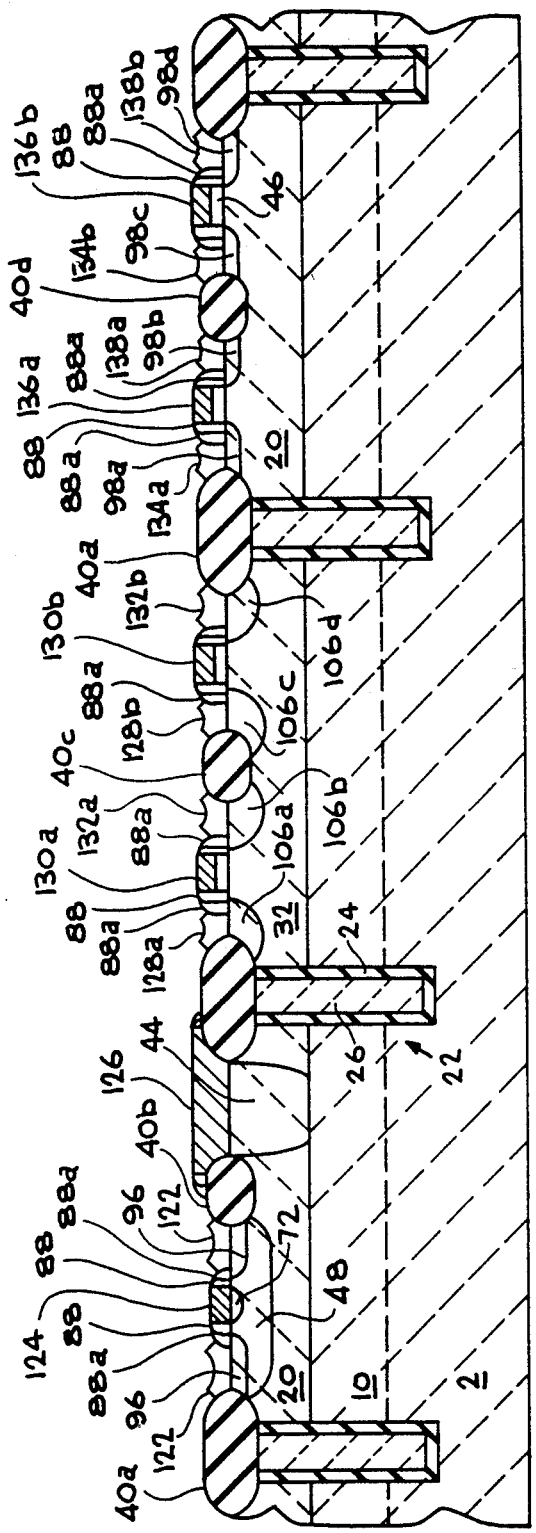

The structure is then blanket etched, as shown in FIG. 10, to clear the base, source, and drain contacts. When planarization layer 116 is etched in this manner, additional spacer members 88a, comprising remnants of planarization layer 116, are left adjacent spacers 88, as further shown in FIG. 10. Spacers 88a act in conjunction with spacers 88 to separate the contacts from one another. Alernatively, these contacts may be "cut" by opening vias onto the silicide. A metal layer, e.g., a 0.8 micron layer of aluminum over a barrier layer of TiW, is then deposited over the structure and masked to provide metal contacts 122, 124, and 126 in the bipolar region; source contacts 128a and 128b, gate contacts 130a and 130b, and drain contacts 132a and 132b in the NMOS region; and source contacts 134a and 134b, gate contacts 136a and 136b, and drain contacts 138a and 138b in the PMOS region.

The foregoing describes one embodiment of the invention wherein the use of oxide spacers on the sides of both the emitter and the gate, coupled with the removal of the gate oxide over the source and drain, and the use of metal silicide over the contacts provides a more compact structure with self aligned contacts.

However, in yet another embodiment, as will be explained below, the techniques described may be also used to provide a structure which is highly planarized due to the provision of all raised polysilicon contacts, i.e. raised base, source, and drain contacts as well as the raised emitter, collector, and gate contacts just described.

Figure 11:
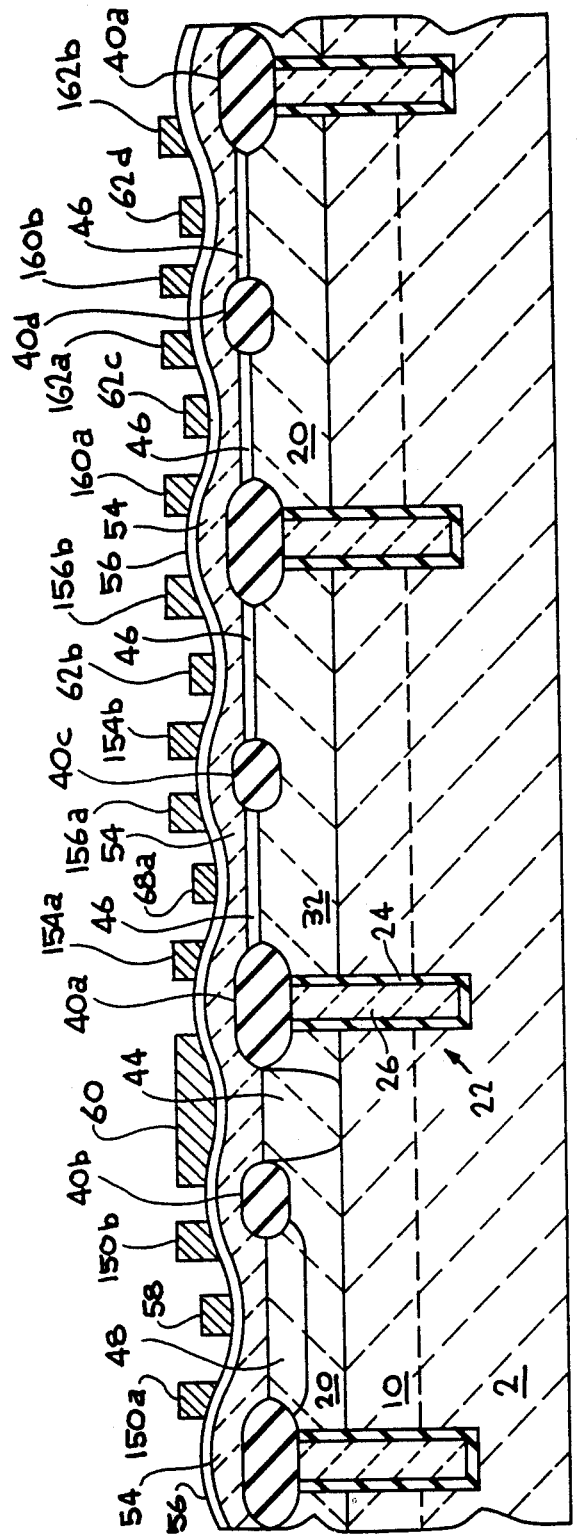
FIGS. 11–16 are fragmentary vertical cross-sectional views illustrating subsequent stages of the construction of another embodiment of the improved integrated circuit structure of the invention.

Turning now to FIG. 11, the structure previously described in FIGS. 1-4, is masked somewhat differently from the mask of FIG. 5 in the previous embodiment in that base masks 150a and 150b are also provided as well as NMOS source masks 154a and 154b, NMOS drain masks 156a and 156b, PMOS source masks 160a and 160b, and PMOS drain masks 162a and 162b.

Figure 12:
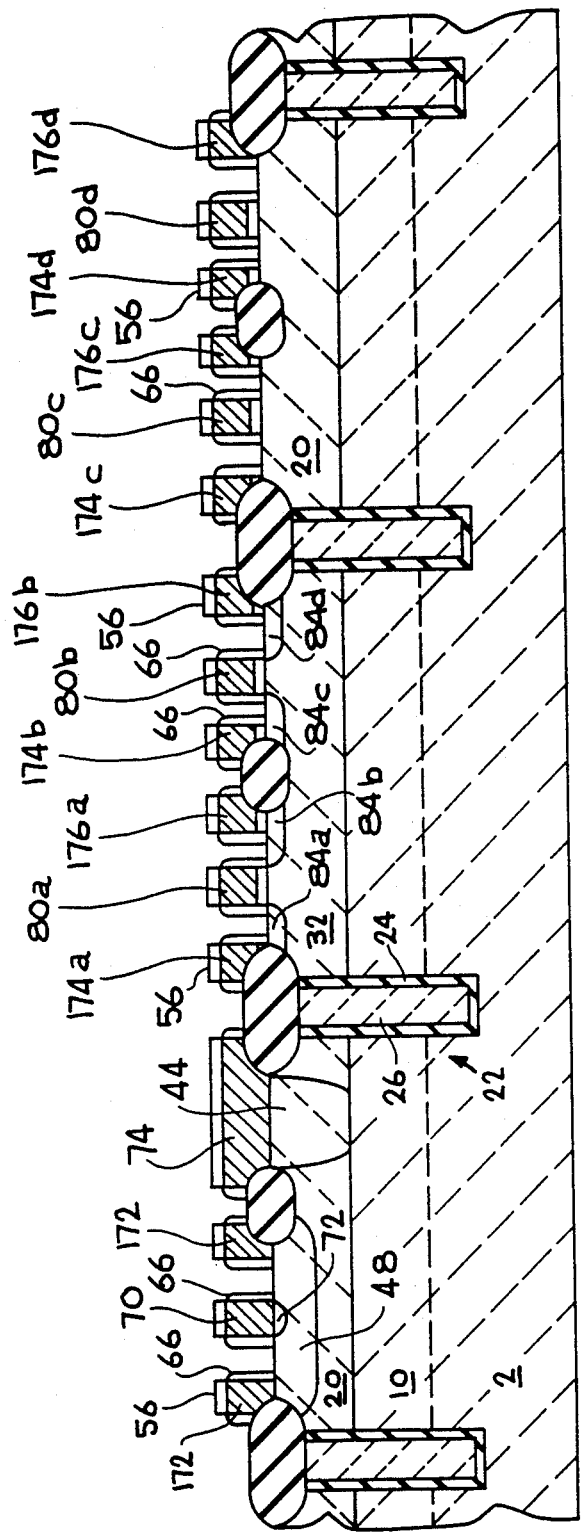

The remainder of the polysilicon is then removed as well as the underlying nitride layer as in the previously described embodiment leaving a raised polysilicon base contact 172, raised polysilicon emitter contact 70, raised polysilicon collector contact 74, raised polysilicon source contacts 174a–174d, raised polysilicon gate contacts 80a–80d, and raised polysilicon drain contacts 176a–176d as shown in FIG. 12.

At this point the exposed portions of gate oxide layer 46 over the source and drain regions (in between the raised polysilicon source and gate contacts or in between the raised polysilicon gate and drain contacts) may be removed.

Figure 13:
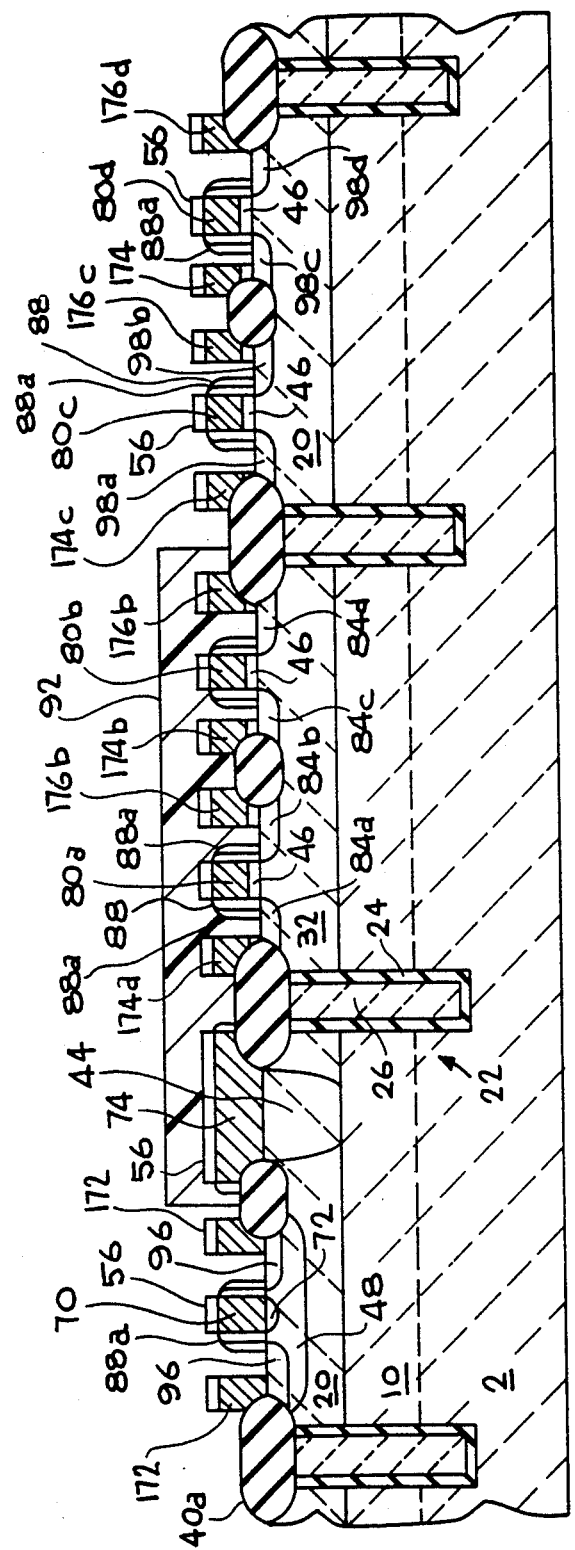
Figure 14:
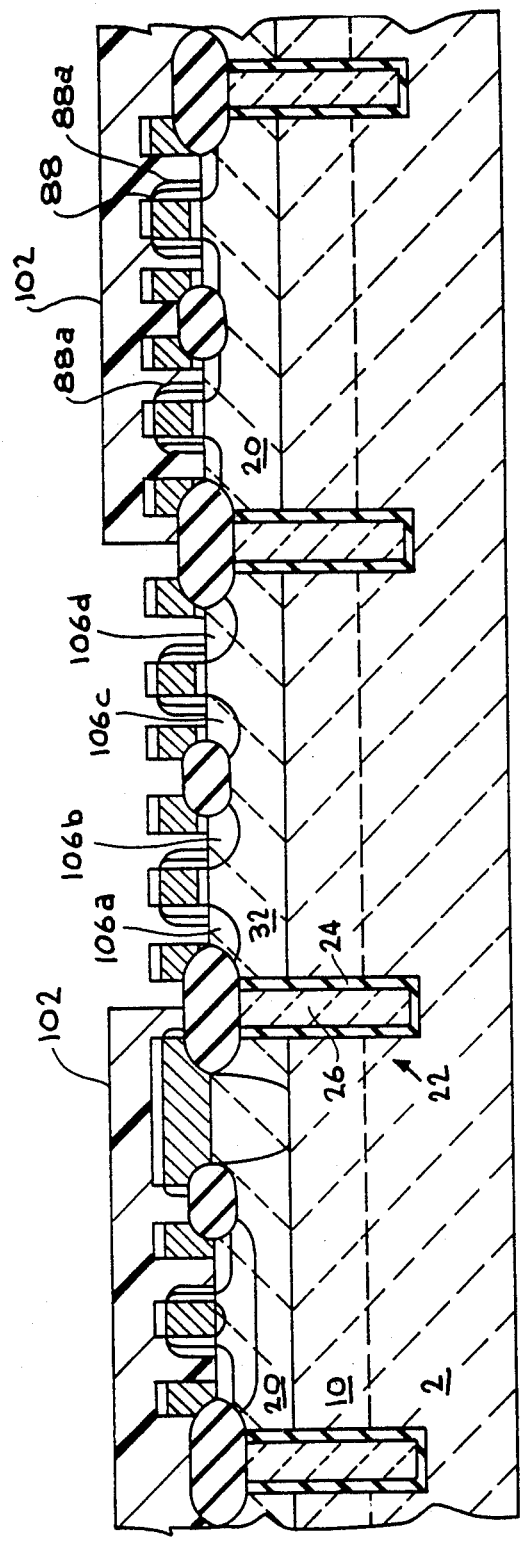
Figure 15:
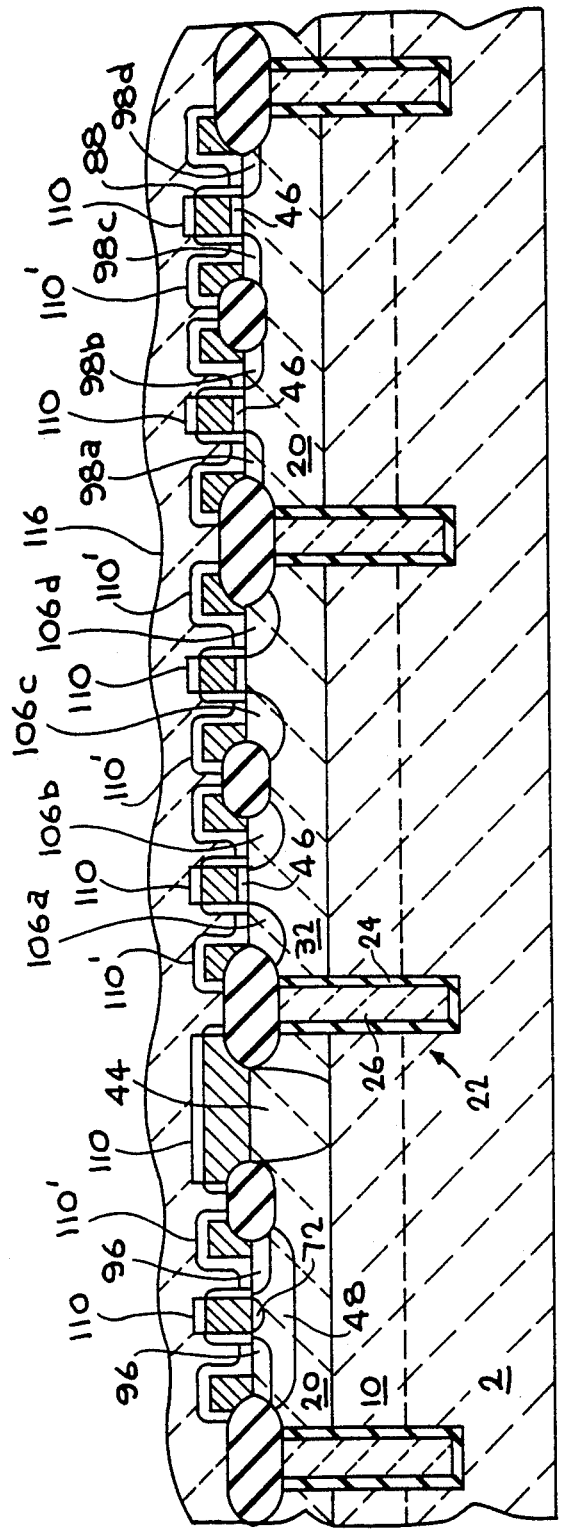

The resultant structure is then processed in FIGS. 13-15 in similar fashion to the process steps described and illustrated in FIGS. 7-9 to form oxide spacers 88 on the sidewalls of the raised polysilicon contacts. However, as shown in FIGS. 13 and 14, since all of the contacts are now raised in this embodiment, the oxide spacers, formed on the sides of the raised base, source and drain contacts, are removed prior to the implantation steps by appropriate masking of the emitter, collector, and gate regions. The respective areas in FIGS. 13 and 14 are then masked in similar fashion to that shown for FIGS. 7 and 8 to form the respective source and drain implants in the PMOS and NMOS regions as well as the P+ base implantation in the bipolar region.

The silicide step then forms a conductive coating or layer of silicide 110' on the top and sides of the raised polysilicon base, source, and drain contacts as well as over the extrinsic base region 96 and over the source and drain regions to provide low resistance current paths to the respective raised electrode contacts as shown in FIG. 15.

As in the previous embodiment shown in FIG. 9, a layer of oxide 116 is then formed over the structure after the siliciding step as also seen in FIG. 15. However, unlike the prior embodiment, subsequent planarization opens all the contacts making further selective etching to clear the base, source, and drain contacts unnecessary.

Figure 16:
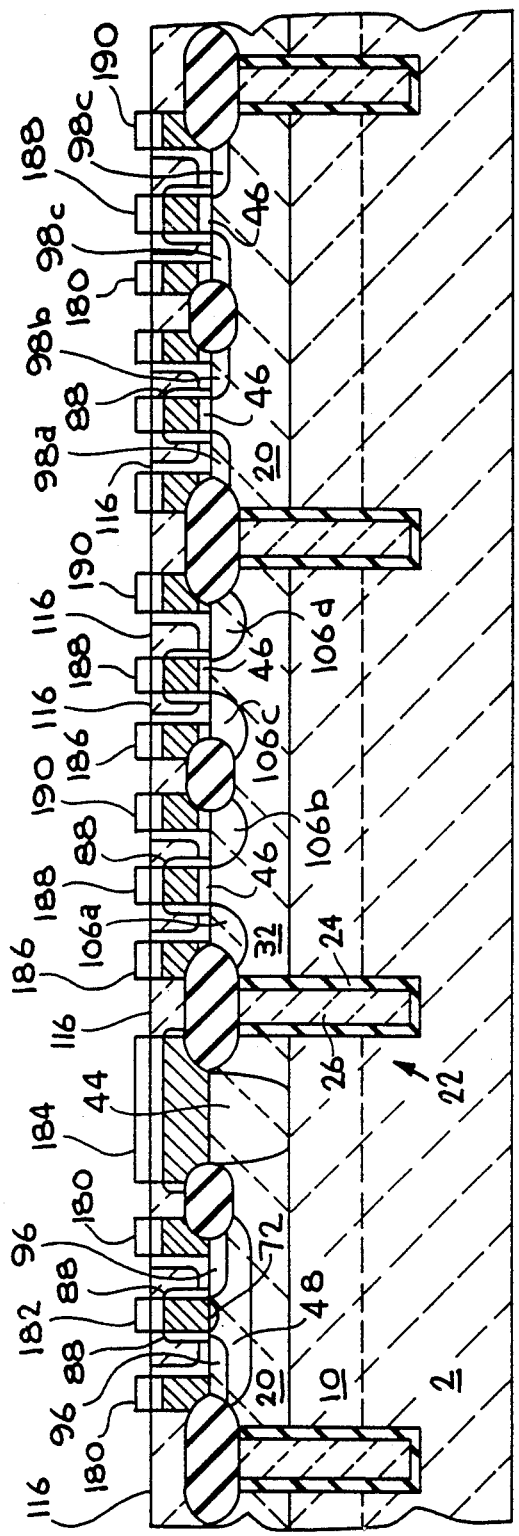

The final metallization and masking steps then form metal base contact 180, metal emitter contact 182, metal connector contact 184, metal source contacts 186, metal gate contacts 188, and metal drain contacts 190. The resultant structure, as seen in FIG. 16, is a highly planarized structure with all self aligned contacts.

The resulting integrated circuit structure comprises a combination of bipolar and MOS devices wherein the bipolar devices operate faster due to the low resistance between the intrinsic base and the base contact with high base resistance only under the emitter and oxide spacers since the remainder of the base is in contact with the metal silicide, thus efffectively eliminating the relatively high resistance and high collector-base capacitance of the extrinsic base regions of prior art devices. The use of polysilicon emitters also results in a device having higher gain by preventing reverse injection of minority carriers from the base to the emitter.

Furthermore, the invention provides an improved construction of the MOS devices which facilitates the formation of contacts thereto without cutting through the passivation glass to reach the source and drain regions thereby eliminating the critical alignment and process tolerance associated with via contacts. The gate resistance is lowered by using a polysilicon gate with direct contact to the gate polysilicon over the channel instead of bringing the contact to the side of the channel. In addition, the use of self aligned contacts permits a more compact construction by eliminating the need for protective oxides around cut areas.

Finally, the use of all raised polysilicon electrode contacts with metal silicide conductive paths thereon, in one embodiment of the invention, results in the provision of a very planarized structure possessing high speed and low resistance and capacitance.

Having thus described the invention, what is claimed is:

1. A process for producing an improved integrated circuit structure containing at least one bipolar device and at least one MOS device which comprises:
   (a) forming a single layer of polysilicon on a substrate;
   (b) forming on said substrate an emitter having a raised contact portion formed from said polysilicon layer, a raised collector contact portion formed from said polysilicon layer, and a gate having a raised contact portion formed from said polysilicon layer;
   (c) forming an insulating spacer adjoining the sidewall of said raised emitter contact portion and an insulating spacer adjoining the sidewall of said raised gate contact portion;
   (d) forming base contact means having a conductive path portion adjacent the insulating spacer adjoining said raised emitter contact portion;
   (e) forming a source contact means having a conductive path portion adjacent said insulating spacer adjoining said raised gate portion; and
   (f) forming a drain contact means having a conductive path portion adjacent said insulating spacer adjoining said raised gate portion.

2. The process of claim 1 wherein said step of forming said conductive path portions comprises forming a layer of a conductive metal silicide to provide a low resistance path to said electrode contact means.

3. The process of claim 1 wherein said bipolar device is constructed on a silicon substrate and said conductive portion of said base contact means is formed by the steps of: depositing, on said silicon substrate between said insulating spacer and said base contact means, a metal capable of reacting with said silicon substrate to form a metal silicide; and reacting said metal with said silicon substrate to form said metal silicide to provide a conductive path between said spacer and said base contact means.

4. A process for producing an improved integrated circuit structure containing at least one bipolar device and at least one MOS device which comprises:
   (a) forming on a substrate an emitter having a raised contact portion, a raised collector contact portion, and a gate having a raised contact portion comprising the steps of:
      (i) depositing a layer of polysilicon on said substrate;
      (ii) doping said polysilicon sufficiently to alter the conductivity to permit formation of said electrode contacts therefrom;
      (iii) masking said doped polysilicon to define said electrode contacts; and
      (iv) removing the remainder of said polysilicon.
   (b) forming an insulating spacer adjoining the sidewall of said raised emitter contact portion and an insulating spacer adjoining the sidewall of said raised gate contact portion; and
   (c) locating a conductive path portion of another electrode contact means adjacent at least one of said spacers to thereby lower the resistance path between said another electrode and said contact portion adjoining said insulating spacer.

5. The process of claim 4 including the further steps of:
   (a) heating said structure sufficiently to form a protective oxide layer on the sidewalls of said polysilicon and to diffuse said emitter into said substrate to form a shallow emitter; and
   (b) forming insulating spacers adjoining the sidewall of said raised emitter and gate contacts portions.

6. The process of claim 5 wherein said step of forming said insulating spacers includes the steps of depositing a layer of insulating material over said structure; and removing said insulating material by a process which will leave said insulating spacer on the sidewall of said polysilicon emitter and gate contact portions.

7. The process of claim 6 wherein said step of removing said insulating material to leave said insulating spacer on the sidewall of said polysilicon emitter and gate contact portions comprises removing said insulating material with a reactive ion etch.

8. A process for producing an improved integrated circuit structure containing at least one bipolar device and at least one MOS device which comprises:
   (a) forming source, drain, and intrinsic base regions in a substrate;
   (b) forming a layer of polysilicon on said substrate;
   (c) forming on said substrate an emitter having a raised contact portion formed from said layer of polysilicon, a raised collector contact portion formed from said layer of polysilicon, and a gate having a raised contact portion formed from said layer of polysilicon;
   (d) forming an insulating spacer adjoining the sidewall of said raised emitter contact portion and an insulating spacer adjoining the sidewall of said raise gate contact portion;
   (e) forming base contact means on said substrate including a metal silicide conductive path portion on said substrate adjacent the insulating spacer adjoining said raised emitter contact portion and over said intrinsic base region in said substrate;
   (f) forming a source contact means on said substrate including a metal silicide conductive path portion on said substrate adjacent said insulating spacer adjoining said raised gate portion and over said source region in said substrate; and
   (g) forming a drain contact means on said substrate including a metal silicide conductive path portion on said substrate adjacent said insulating spacer adjoining said raised gate portion and over said drain region in said substrate.

9. The process of claim 8 wherein said bipolar and MOS devices are constructed on a silicon substrate and said metal silicide conductive path portions of said base contact means, source contact means, and drain contact means are formed by the steps of:
   (a) depositing, on said silicon substrate between said insulating spacers and said base contact means, source contact means, and drain contact means, a metal capable of reacting with said silicon substrate to form a metal silicide; and
   (b) reacting said metal with said silicon substrate to form said metal silicide to provide said conductive paths between said spacers and said base contact means, source contact means, and drain contact means.

10. A process for forming an integrated circuit structure comprising at least one bipolar devices and at least one MOS devices which comprises the steps of:
   (a) forming a buried layer in a semiconductor substrate;
   (b) growing an epitaxial layer of silicon over said buried layer;

(c) forming at least one isolation zone in said structure to separate adjoining active devices;

(d) forming a gate oxide over at least a portion of the surface of said epitaxial layer;

(e) removing said gate oxide from the surface of a portion of said epitaxial layer;

(f) forming a sinker in a portion of said epitaxial layer to provide an electrical contact to said buried layer;

(g) forming an intrinsic base in one portion of said epitaxial layer separated from said sinker by an isolation zone;

(h) forming a layer of doped polysilicon over said structure;

(i) masking said polysilicon to define at least emitter, collector, and gate contact portions and removing the remainder of said polysilicon;

(j) doping said exposed portions of said epitaxial layer to form said source and drain regions;

(k) forming spacers adjoining the sidewall of said polysilicon emitter and gate contact portions;

(l) removing gate oxide from further portions of said substrate surface to expose portions of said epitaxial layer corresponding to source and drain regions;

(m) forming a metal silicide over said emitter, collector, and gate contact portions, said source and drain regions, and said intrinsic base region;

(n) forming a layer of an insulating material over said structure;

(o) planarizing said structure to remove sufficient insulating material to expose the top portion of said emitter, collector, and gate contact portions; and (p) opening up contacts through said insulating material to said base, source, and drain regions.

11. The process of claim 10 wherein said step of forming at least one isolation zone in said structure includes forming at least one isolation zone which extends through said epitaxial layer and said buried layer to isolate one type of device from another.

12. The process of claim 10 including the further step of forming a P well in a portion of said epitaxial layer after formation of said isolation zone to permit formation of an NMOS device.

13. The process of claim 10 wherein said step of forming said oxide spacers adjoining the sidewall of said polysilicon emitter and gate portions comprises the steps of forming a layer of an oxide material over said structure and selectively removing said insulating material to leave said oxide spacers adjoining said raised polysilicon emitter and gate portions.

14. The process of claim 13 wherein said selective removal of said insulating material is done with a reactive ion etch.

15. The process of claim 10 wherein said step of masking said layer of doped polysilicon to define said emitter, collector, and gate contact portions further comprises masking said polysilicon to define base, source, and drain contact regions.

16. The process of claim 15 wherein said step of forming said oxide spacers adjoining the sidewall of said polysilicon emitter and gate portions comprises the steps of forming a layer of an oxide material over said structure; selectively removing said insulating material with a reactive ion etch to leave said oxide spacers adjoining said raised polysilicon contacts; and masking said structure to remove oxide portions adjoining said raised base, source, and drain contact regions.

17. The process of claim 16 wherein said step of forming a metal silicide further comprises forming said metal silicide on the sidewalls of said base, source, and drain contacts after removal of said oxide spacers therefrom whereby conductive paths are established from the top of said raised base, source, and drain contacts to said base, source, and drain regions formed in said epitaxial layer.

18. The process of claim 17 wherein said step of planarizing said structure to expose the top surface of said emitter, collector, and gate contacts also exposes the top surface of said base, source, and drain contacts whereby said surface of said structure is relatively free of steps.

19. A process for forming a highly planarized integrated circuit structure comprising one or more bipolar devices and one or more MOS devices which comprises the steps of:

(a) forming a buried layer in a semiconductor substrate;

(b) growing an epitaxial layer of silicon over said buried layer;

(c) forming at least one isolation zone in said structure to separate adjoining active devices;

(d) forming a gate oxide over at least a portion of the surface of said epitaxial layer;

(e) removing said gate oxide from the surface of a portion of said epitaxial layer defining base emitter, collector, source, and drain contact regions;

(f)) forming a sinker in a portion of said epitaxial layer to provide an electrical contact to said buried layer;

(g) forming an intrinsic base in one portion of said epitaxial layer separated from said sinker by an isolation zone;

(h) forming source and drain regions in another portion of said epitaxial layer;

(i) forming a layer of doped polysilicon over said structure;

(j) masking said polysilicon to define raised base, source, drain, emitter, collector, and gate contact portions and removing the remainder of said polysilicon;

(k) forming insulating spacers adjoining the sidewall of said raised polysilicon contact portions;

(l) removing said spacers from the sidwalls of said raised source, drain, and base contact portions leaving said spacers on the sidewalls of said raised polysilicon emitter, collector, and gate contact portions;

(m) removing gate oxide from further portions of said substrate surface to expose portions of said epitaxial layer corresponding to source and drain regions;

(n) forming a metal silicide over said emitter, collector, and gate contact portions, said source and drain regions, said intrinsic base region, and over the top and exposed sidewall surfaces of said raised source, drain, and base contact portions;

(o) forming a layer of an insulating material over said structure;

(p) planarizing said structure to remove sufficient insulating material to expose the top portion of said raised source, drain, base, emitter, collector, and gate contact portions to form a highly planarized structure.

* * * * *